United States Patent
Park et al.

(10) Patent No.: US 9,112,432 B2
(45) Date of Patent: Aug. 18, 2015

(54) PIEZOELECTRIC GENERATOR AND METHOD OF MANUFACTURING THE SAME

(71) Applicants: SAMSUNG ELECTRONICS CO., LTD., Suwon-si (KR); GEORGIA TECH RESEARCH CORPORATION, Atlanta, GA (US)

(72) Inventors: Young-jun Park, Suwon-si (KR); Zhong-lin Wang, Atlanta, GA (US); Sang-min Lee, Pohang-si (KR)

(73) Assignees: SAMSUNG ELECTRONICS CO., LTD., Suwon-si (KR); GEORGIA TECH RESEARCH CORPORATION, Atlanta, GA (US)

( * ) Notice: Subject to any disclaimer, the term of this patent is extended or adjusted under 35 U.S.C. 154(b) by 189 days.

(21) Appl. No.: 13/714,671

(22) Filed: Dec. 14, 2012

(65) Prior Publication Data
US 2014/0167563 A1  Jun. 19, 2014

(51) Int. Cl.
| | |
|---|---|
| H01L 41/113 | (2006.01) |
| H02N 2/18 | (2006.01) |
| H01L 41/18 | (2006.01) |
| H01L 41/317 | (2013.01) |
| B82Y 40/00 | (2011.01) |
| H01L 41/047 | (2006.01) |

(52) U.S. Cl.
CPC .................. *H02N 2/18* (2013.01); *H01L 41/18* (2013.01); *H01L 41/317* (2013.01); *B82Y 40/00* (2013.01); *H01L 41/0477* (2013.01); *Y10S 977/84* (2013.01); *Y10S 977/948* (2013.01); *Y10T 29/42* (2015.01)

(58) Field of Classification Search
CPC ................................ B82Y 30/00; B82Y 35/00
USPC ......... 310/339, 340, 358, 363–366; 29/25.35; 427/100; 977/742, 750, 837
See application file for complete search history.

(56) References Cited

U.S. PATENT DOCUMENTS

| | | | | |
|---|---|---|---|---|
| 4,025,338 | A * | 5/1977 | Miyatuka et al. | 430/97 |
| 6,586,095 | B2 | 7/2003 | Wang et al. | |
| 7,705,523 | B2 | 4/2010 | Wang et al. | |
| 8,039,834 | B2 | 10/2011 | Wang et al. | |
| 2007/0186689 | A1* | 8/2007 | Fukuda et al. | 73/862.68 |
| 2009/0015109 | A1* | 1/2009 | Schuh | 310/364 |
| 2009/0066195 | A1 | 3/2009 | Wang et al. | |
| 2009/0115293 | A1* | 5/2009 | Wang et al. | 310/364 |
| 2009/0309843 | A1 | 12/2009 | Kim et al. | |
| 2010/0117488 | A1 | 5/2010 | Wang et al. | |
| 2010/0147789 | A1* | 6/2010 | Kurachi et al. | 216/13 |
| 2011/0107569 | A1 | 5/2011 | Wang et al. | |
| 2011/0220391 | A1 | 9/2011 | Oka et al. | |
| 2012/0133247 | A1 | 5/2012 | Lee et al. | |

(Continued)

FOREIGN PATENT DOCUMENTS

| | | |
|---|---|---|
| KR | 10-2011-0101287 A | 9/2011 |
| KR | 10-2012-0036579 A | 4/2012 |

(Continued)

*Primary Examiner* — Thomas Dougherty
(74) *Attorney, Agent, or Firm* — Sughrue Mion, PLLC

(57) ABSTRACT

Provided are flexible piezoelectric generators and methods of manufacturing the same. The piezoelectric generator includes a first insulation layer disposed on a first electrode, a piezoelectric structure disposed on the first insulation layer, a second insulation layer disposed on the piezoelectric structure, and a second electrode disposed on the second insulation layer.

17 Claims, 6 Drawing Sheets

(56) References Cited

U.S. PATENT DOCUMENTS

2012/0293047 A1* 11/2012 Wang et al. .................... 310/339
2013/0119821 A1*  5/2013 Hino et al. .................... 310/300
2013/0228952 A1   9/2013 Mori et al.
2014/0167560 A1*  6/2014 Onda ............................ 310/311

FOREIGN PATENT DOCUMENTS

| KR | 10-1148016 B1 | 5/2012 |
| KR | 10-1172279 B1 | 8/2012 |
| KR | 10-20120092466 A | 8/2012 |

* cited by examiner

PIEZOELECTRIC GENERATOR AND METHOD OF MANUFACTURING THE SAME

BACKGROUND

1. Field

The present disclosure relates to generators, and more particularly, to large-area flexible piezoelectric generators and methods of manufacturing the same.

2. Description of the Related Art

Recently, techniques for harvesting energy have received much interest and have been the focus of research. Piezoelectric generators among devices for harvesting energy may be considered as environmentally friendly energy generating devices which may transform mechanical energy generated by vibration existing in a surrounding environment or the motion of the human body into electric energy. Also, research into developing flexible piezoelectric nanogenerators by using nanosystems has been conducted according to the development of nanotechnologies. Such piezoelectric nanogenerators may be used for harvesting electric energy by using mechanical energy generated due to the mechanical motion or vibration in an external environment, such as wind, or the motion of the human body, and may be also used as a sensor for detecting external environmental changes or microscopic motion.

SUMMARY

Exemplary embodiments provide large-area flexible piezoelectric generators and methods of manufacturing the same.

Additional aspects will be set forth in part in the description which follows and, in part, will be apparent from the description, or may be learned by practice of the presented embodiments.

According to an aspect of an embodiment, there is provided a piezoelectric generator including: a first electrode; a first insulation layer disposed on the first electrode; a piezoelectric structure disposed on the first insulation layer; a second insulation layer disposed on the piezoelectric structure; and a second electrode disposed on the second insulation layer.

The first electrode may be a flexible and conductive substrate. Herein, the first electrode may include a metal substrate or a conductive polymer substrate. The metal substrate may include at least one of aluminum (Al), copper (Cu), gold (Au), and silver (Ag). The first electrode may have a thickness of about 500 µm or less.

The first electrode may be disposed on a flexible plastic substrate. Herein, the first electrode may include metal, a conductive polymer, or graphene. The plastic substrate may have a thickness of about 500 µm or less.

The first and the second insulation layers may include a polymer, for example, polymethyl methacrylate (PMMA). The first and the second insulation layers may have a thickness of about 2 µm or less.

The piezoelectric structure may include a plurality of piezoelectric nanowires. The piezoelectric nanowires may include ZnO, $ZnSnO_3$, or SnO. A seed layer may be further disposed between the first insulation layer and the piezoelectric nanowires. The seed layer may include at least one of ZnO, zinc (Zn), $ZnSnO_3$, SnO, tin (Sn), and Au.

The piezoelectric structure may include a piezoelectric thin film. The piezoelectric thin film may include ZnO, $ZnSnO_3$, SnO, $BaTiO_3$, $NaNbO_3$, lead zirconate titanate (PZT), or polyvinylidene fluoride (PVDF).

According to an aspect of another embodiment, there is provided a method of manufacturing a piezoelectric generator includes: preparing a first electrode; coating the first electrode with a first insulation layer; growing piezoelectric nanowires on the first insulation layer by using a hydrothermal process; coating the piezoelectric nanowires with a second insulation layer; and depositing a second electrode on the second insulation layer.

BRIEF DESCRIPTION OF THE DRAWINGS

The above and/or other aspects will become apparent and more readily appreciated from the following description of embodiments, taken in conjunction with the accompanying drawings of which.

DETAILED DESCRIPTION

Figure 1:
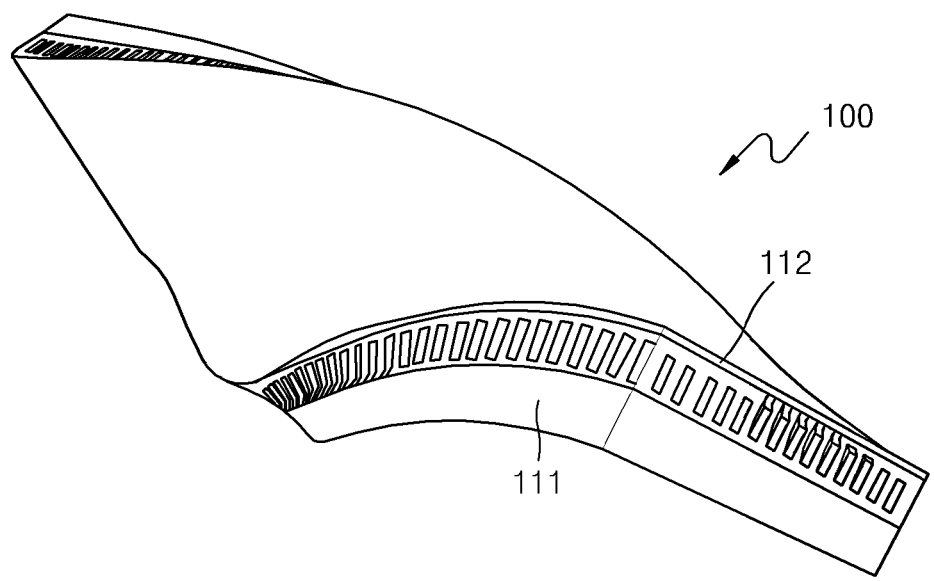
FIG. 1 is a perspective view illustrating a flexible piezoelectric generator according to an exemplary embodiment.

Hereinafter, exemplary embodiments will be described in detail with reference to the accompanying drawings. The present disclosure may, however, be embodied in many different forms and should not be construed as being limited to the embodiments set forth herein. Rather, these embodiments are provided so that this disclosure will be thorough and complete, and will fully convey the concept of the invention to those skilled in the art. Like reference numerals in the drawings denote like elements. In the drawings, the thicknesses of layers and regions are exaggerated for clarity. It will also be understood that when a layer is referred to as being "on" another layer or substrate, it can be directly on the other layer or substrate, or intervening layers may also be present. Expressions such as "at least one of," when preceding a list of elements, modify the entire list of elements and do not modify the individual elements of the list.

Figure 2:
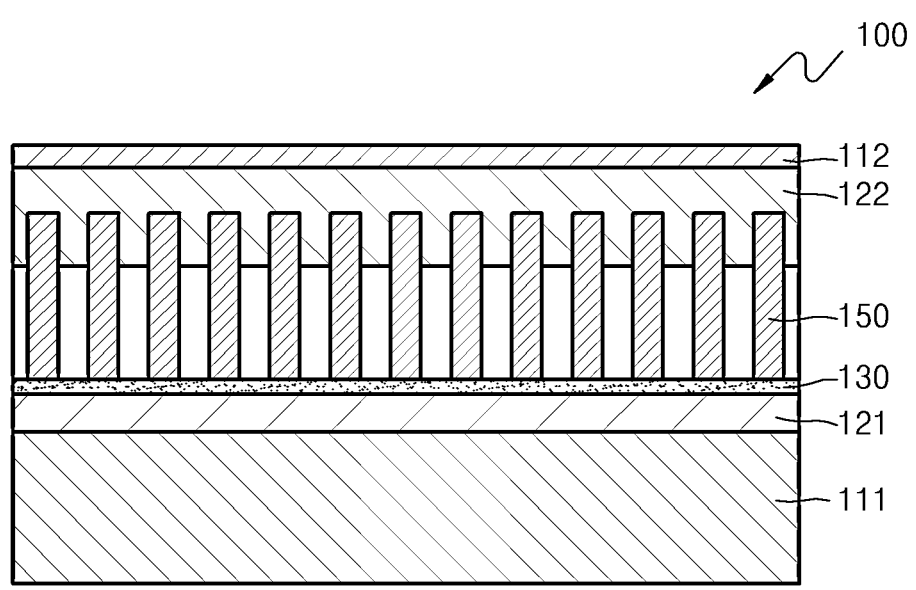
FIG. 2 is a cross-sectional view of the piezoelectric generator illustrated in FIG. 1.

FIG. 1 is a perspective view illustrating a flexible piezoelectric generator according to an exemplary embodiment. FIG. 2 is a cross-sectional view of the piezoelectric generator 100 illustrated in FIG. 1.

Referring to FIGS. 1 and 2, the piezoelectric generator 100 includes first and second electrodes 111 and 112 disposed by being spaced apart from each other, first and second insulation layers 121 and 122 disposed on the first and second electrodes 111 and 112, respectively, and a piezoelectric structure disposed between the first and second insulation layers 121 and 122. The first electrode 111 may be a flexible electrode substrate. That is, the first electrode 111 may be a flexible and conductive substrate. For example, the first electrode 111 may be a metal substrate or a conductive polymer substrate. Herein, the metal substrate, for example, may include at least one of aluminum (Al), copper (Cu), gold (Au), and silver (Ag). However, these are only examples and various metals may be included. The first electrode 111 may have a thickness of about 500 μm or less and, for example, the first electrode 111 may have a thickness of about 50 μm or less. However, the thickness of the first electrode 111 is not limited thereto.

The first insulation layer 121 disposed on the first electrode 111 may act to prevent a short circuit between the first electrode 111 and the second electrode 112, and uniformly grow piezoelectric nanowires 150 to be later described on the first insulation layer 121. The first insulation layer 121 may include a flexible material having a high dielectric constant. For example, the first insulation layer 121 may include a polymer such as polymethyl methacrylate (PMMA). However, the material of the first insulation layer 121 is not limited thereto. The first insulation layer 121 may have a thickness of about 2 μm. For example, the first insulation layer 121 may have a thickness of about 200 nm or less. However, the thickness of the first insulation layer 121 is not limited thereto.

A piezoelectric structure is disposed on the first insulation layer 121. Specifically, the plurality of piezoelectric nanowires 150 are disposed on the first insulation layer 121. Herein, the piezoelectric nanowires 150 may be arranged perpendicular to or inclined at a predetermined angle with respect to the first insulation layer 121. The piezoelectric nanowires 150 may include a material generating piezoelectric potential at both ends thereof by deformation. For example, the piezoelectric nanowires 150 may be ZnO nanowires and, in addition, the piezoelectric nanowires 150 may be $ZnSnO_3$ nanowires or SnO nanowires. However, the material of the piezoelectric nanowires 150 is not limited thereto. A seed layer 130 may be further disposed on the first insulation layer 121 having the piezoelectric nanowires 150 formed thereon. The seed layer 130 is provided to facilitate the growth of the piezoelectric nanowires 150 and, for example, may include at least one of ZnO, zinc (Zn), $ZnSnO_3$, SnO, tin (Sn), and Au.

The second insulation layer 122 is disposed on the piezoelectric nanowires 150. Herein, the second insulation layer 122 may be coated to cover the piezoelectric nanowires 150. The second insulation layer 122 may also be disposed to fill between the piezoelectric nanowires 150. FIG. 2 illustrates the exemplary case in which the second insulation layer 122 is disposed to fill between upper portions of the piezoelectric nanowires 150. Alternatively, the second insulation layer 122 may be disposed to cover the seed layer 130 between the piezoelectric nanowires 150. The second insulation layer 122 acts to prevent a short circuit between the first electrode 111 and the second electrode 112. The second insulation layer 122, as the first insulation layer 121, may include a polymer, for example, polymethyl methacrylate (PMMA). However, the material of the second insulation layer 122 is not limited thereto. The second insulation layer 122 may have a thickness (specifically, a thickness of the second insulation layer 122 between a top surface of the piezoelectric nanowire 150 and a bottom surface of the second electrode 112) of about 2 μm, and for example, the second insulation layer 122 may have a thickness of about 200 nm or less. However, the second insulation layer 122 is not limited thereto. The second electrode 112 is disposed on the second insulation layer 122. Herein, the second electrode 112 may include a conductive material such as metal, graphene, and a conductive polymer.

The foregoing flexible piezoelectric generator 100 may be manufactured by the following exemplary method. First, a first electrode 111 formed of a flexible and conductive substrate, such as a metal substrate or a conductive polymer substrate, is prepared. A first insulation layer 121 is formed on the first electrode 111 by coating with a polymer, for example, PMMA. Thereafter, a seed layer 130 is deposited on the first insulation layer 121 and piezoelectric nanowires 150 are then grown on the seed layer 130 through a hydrothermal process. For example, the piezoelectric nanowires 150 may include ZnO, $ZnSnO_3$, or SnO. The seed layer 130, for example, may include at least one of ZnO, Zn, $ZnSnO_3$, SnO, Sn, and Au. For example, a growth solution including Zn is prepared and maintained at a predetermined temperature (e.g., about 70° C. to about 100° C.), and the hydrothermal process may then be performed by growing ZnO nanowires through dipping the first electrode 111 having the seed layer 130 and the first insulation layer 121 formed thereon in the growth solution for a predetermined time. A second insulation layer 122 is formed on the grown piezoelectric nanowires 150 by coating with a polymer, for example, PMMA, and a second electrode 112 is then formed by forming a conductive material on the second insulation layer 122.

As described above, the piezoelectric generator 100 according to the present exemplary embodiment may prevent a short circuit between the first electrode 111 and the second electrode 112 by forming the thin first and second insulation layers 121 and 122 at both ends of the piezoelectric nanowires 150, may improve power generation performance, and may also be manufactured in a large area.

A method, in which ZnO nanowires are grown on a flexible substrate having a first electrode deposited thereon through a hydrothermal process and the ZnO nanowires are then coated with an insulation layer and a second electrode is deposited, is generally used in order to manufacture a flexible piezoelectric nanogenerator. However, in the case that the ZnO nanowires are grown through a hydrothermal process, since unwanted microscopic particles may be adsorbed, it may be difficult to coat the ZnO nanowires with the insulation layer, and thus, possibility of having a short circuit between the first electrode and the second electrode may be high. In order to prevent a short circuit, a method of increasing a thickness of the insulation layer coated on the ZnO nanowires or a method of only coating the ZnO nanowires having no microscopic particles adsorbed thereon with the insulation layer may be used. However, in the case that the thick insulation layer is formed, since piezoelectric properties (e.g., piezoelectric potential etc.) generated from the ZnO nanowires may not be effectively transferred to the external first and second electrodes, power generation performance may be degraded and a large-area piezoelectric generator may be difficult to be manufactured due to the non-uniform adsorption of the microscopic particles. Meanwhile, in the case that an Al electrode is used as a first electrode for cost reduction purpose, ZnO nanowires may be difficult to be one-dimensionally grown on the first electrode.

Figure 3:
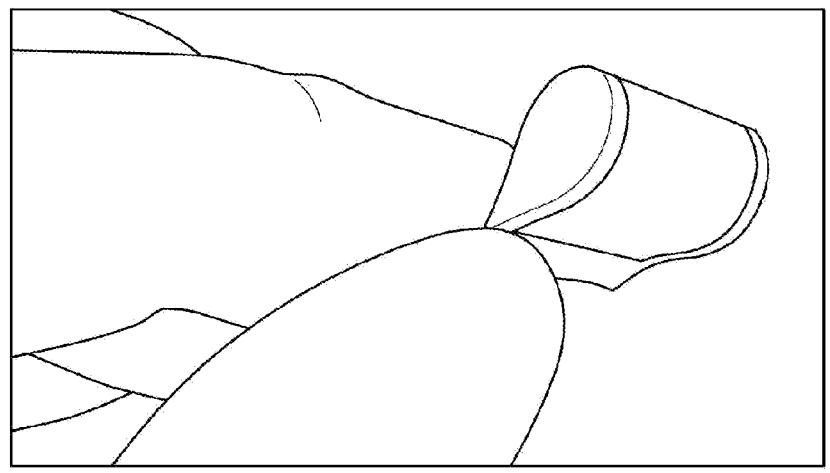
FIG. 3 is an image of a piezoelectric generator according to the exemplary embodiment manufactured by using an aluminum (Al) foil as an electrode substrate.

In the flexible piezoelectric generator 100 according to the present embodiment, the thin first insulation layer 121 composed of a polymer, such as PMMA, is formed on the first electrode 111 before the hydrothermal process is performed, and thus, a short circuit between the first electrode 111 and the second electrode 112 may be prevented. Also, even in the case that an inexpensive metal substrate, such as an Al foil, is used as a first electrode 111, the piezoelectric nanowires 150, such as ZnO nanowires, may be uniformly grown due to the first insulation layer 121 formed on the Al foil. Therefore, a flexible piezoelectric generator may be realized in which ZnO nanowires having excellent piezoelectric properties are grown in a large area on the first electrode 111 formed of the inexpensive metal substrate. FIG. 3 is an image of a flexible piezoelectric generator according to the exemplary embodiment manufactured by using an Al foil as an electrode substrate.

Figure 4:
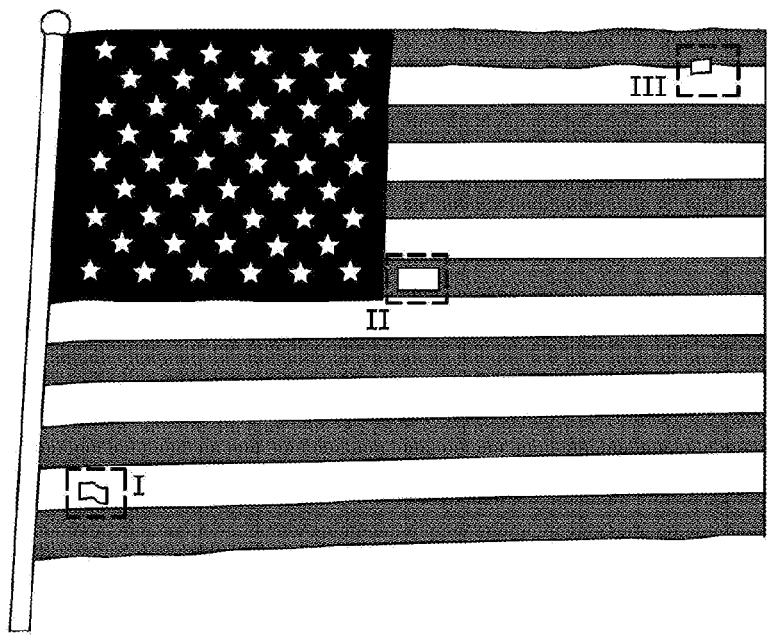
FIG. 4 is an image showing piezoelectric generators according to the exemplary embodiment attached to each position (I, II, and III) on a surface of a flag for experiments to identify energy harvesting from wind.
Figure 5:
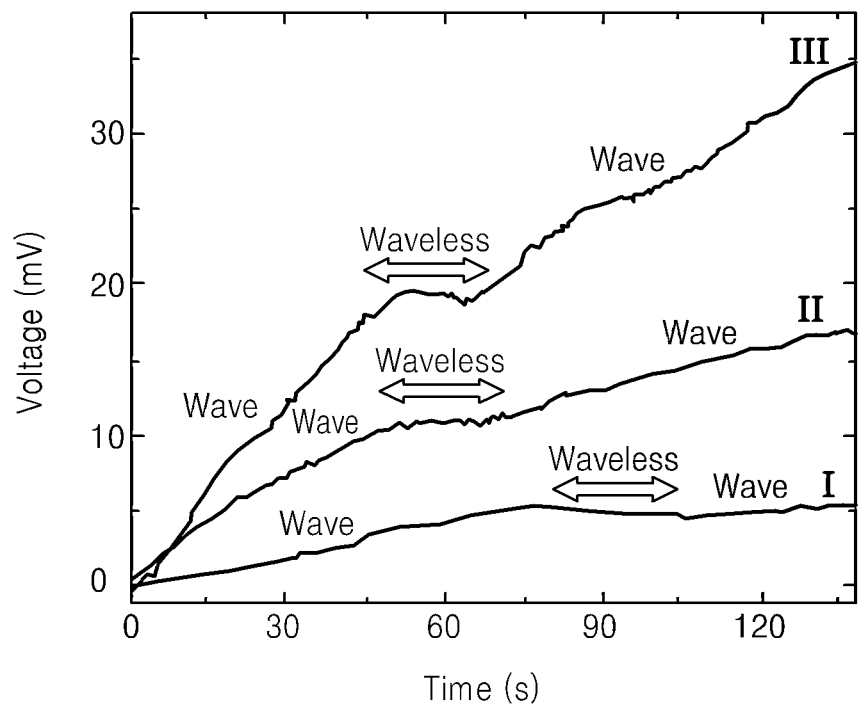
FIG. 5 illustrates energies generated from the piezoelectric generators attached to the each position (I, II, and III) on the surface of the flag illustrated in FIG. 4.

FIG. 4 is a photograph showing piezoelectric generators according to the exemplary embodiment attached to each position (I, II, and III) on a surface of a flag for experiments to identify energy harvesting from wind. FIG. 5 illustrates energies (i.e., voltages) generated from the piezoelectric generators attached to the each position (I, II, and III) on the surface of the flag illustrated in FIG. 4. The results illustrated in FIG. 5 present voltages which are generated from the piezoelectric generators attached to the each position (I, II, and III) on the surface of the flag illustrated in FIG. 4 and stored in capacitors when the wind blows and when the wind does not blow. In FIG. 5, "Wave" denotes a state in which the surface of the flag moves as the wind blows and "Waveless" denotes a state in which the surface of the flag does not move as the wind does not blow. Referring to FIG. 5, it may be understood that voltages are stored only when the wind blows and amounts of the stored voltages are different according to the positions on the surface of the flag. Specifically, it may be understood that the largest amount of voltage is stored from the piezoelectric generator attached to the position III in which the flag moves with the largest amplitude among the positions (I, II, and III) on the surface of the flag.

Figure 6A:
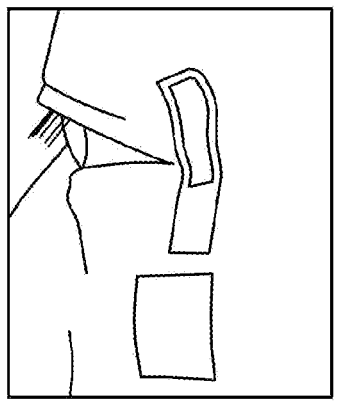
FIGS. 6A and 6B are images showing a piezoelectric generator according to the exemplary embodiment attached to facial skin for experiments to identify detection of the movement of human skin, in which states of eyes open and eyes closed are respectively illustrated.
Figure 6B:
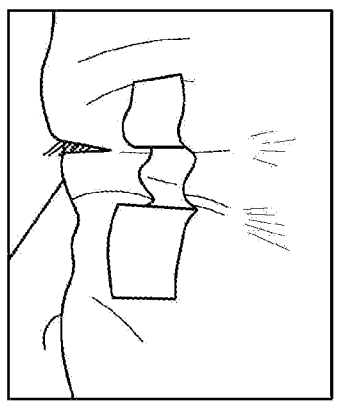
Figure 7:
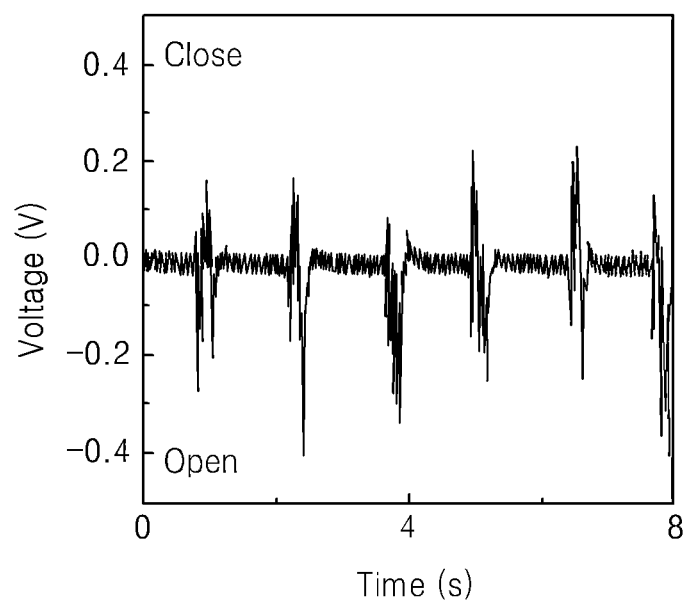
FIG. 7 illustrates the results of the measurements of skin movement signals detected by the piezoelectric generator attached to the facial skin in FIGS. 6A and 6B.

FIGS. 6A and 6B are images showing a piezoelectric generator according to the exemplary embodiment attached to facial skin for experiments to identify detection of the movement of human skin, in which states of eyes open and eyes closed are respectively illustrated. FIG. 7 illustrates the results of the measurements of skin movement signals detected by the piezoelectric generator attached to the facial skin in FIGS. 6A and 6B. Referring to FIG. 7, it may be understood that the movement of skin may be detected when the signals generated from the piezoelectric generator attached to the facial skin are measured.

Figure 8:
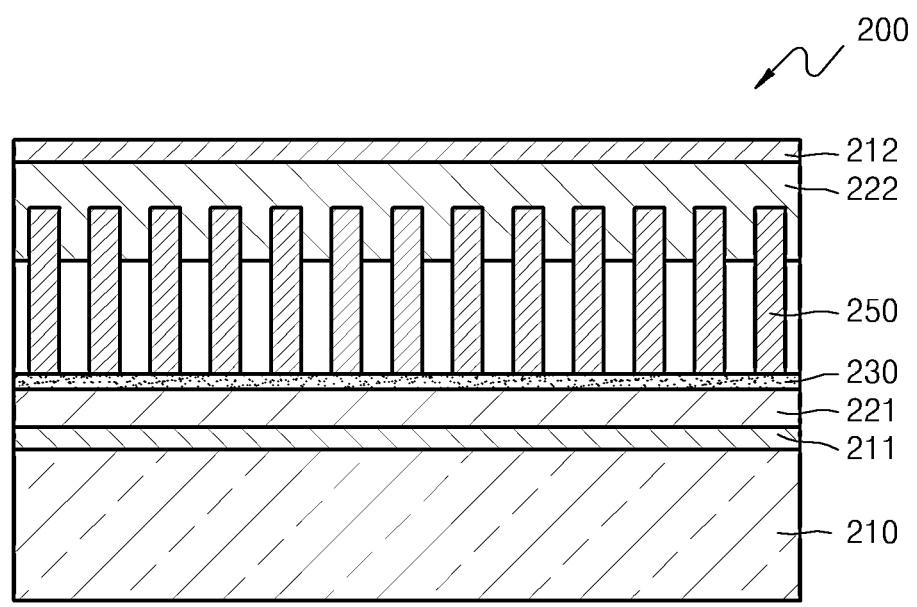
FIG. 8 illustrates a flexible piezoelectric generator according to another exemplary embodiment.

FIG. 8 illustrates a piezoelectric generator 200 according to another exemplary embodiment. Hereinafter, features different from those of the foregoing embodiment will be mainly described.

Referring to FIG. 8, the piezoelectric generator 200 includes a substrate 210, a first electrode 211 disposed on the substrate 210, a first insulation layer 221 disposed on the first electrode 211, a plurality of piezoelectric nanowires 250 arranged on the first insulation layer 221, a second insulation layer 222 disposed on the piezoelectric nanowires 250, and a second electrode 212 disposed on the second insulation layer 222. A flexible plastic substrate may be used as the substrate 210. Herein, the substrate 210 may have a thickness of about 500 μm or less, and for example, the substrate 210 may have a thickness of about 50 μm or less. However, the thickness of the substrate 210 is not limited thereto. The first electrode 211 including a conductive material is disposed on the substrate 210. Herein, the first electrode 211 may be formed by depositing predetermined metal on the substrate 210. The first electrode 211 may be formed of graphene or a conductive polymer.

The first insulation layer 221 is disposed on the first electrode 211. The first insulation layer 221 may act to prevent a short circuit between the first electrode 211 and the second electrode 212, and uniformly grow the piezoelectric nanowires 250 on the first insulation layer 221. The first insulation layer 221 may include a polymer, for example, PMMA. The first insulation layer 221 may have a thickness of about 2 μm, and for example, the first insulation layer 221 may have a thickness of about 200 nm or less. However, the thickness of the first insulation layer 221 is not limited thereto. The plurality of piezoelectric nanowires 250 is disposed on the first insulation layer 221. The piezoelectric nanowires 250 may be arranged perpendicular to or inclined at a predetermined angle to the first insulation layer 221. For example, the piezoelectric nanowires 250 may include ZnO, $ZnSnO_3$, or SnO nanowires, but the piezoelectric nanowires 250 are not limited thereto. A seed layer 230 may be further disposed on the first insulation layer 221 having the piezoelectric nanowires 250 formed thereon. The seed layer 230, for example, may include at least one of ZnO, Zn, $ZnSnO_3$, SnO, Sn, and Au.

The second insulation layer 222 is disposed on the piezoelectric nanowires 250. Herein, the second insulation layer 222 may be coated to cover the piezoelectric nanowires 250. The second insulation layer 222 may include a polymer, for example, PMMA, but the second insulation layer 222 is not limited thereto. The second insulation layer 222 may have a thickness of about 2 μm, and for example, the second insulation layer 222 may have a thickness of about 200 nm or less. The second electrode 212 is disposed on the second insulation layer 222. Herein, the second electrode 212 may include a conductive material such as metal, graphene, and a conductive polymer.

Figure 9:
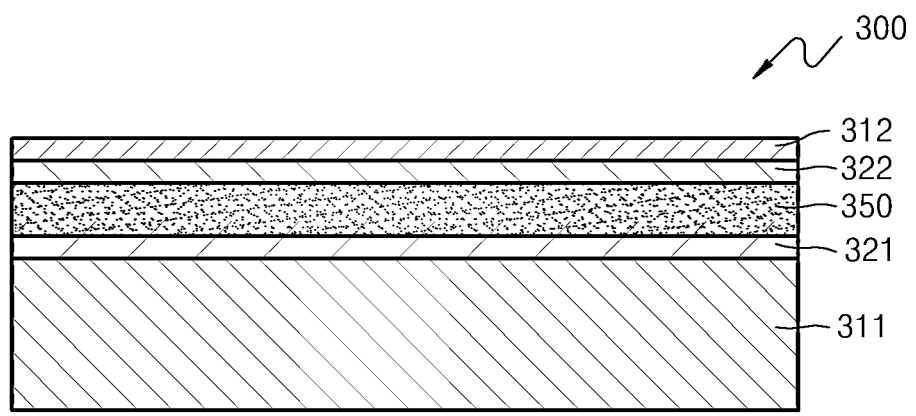
FIG. 9 illustrates a flexible piezoelectric generator according to another exemplary embodiment.

FIG. 9 illustrates a piezoelectric generator 300 according to another exemplary embodiment. Hereinafter, features different from those of the foregoing embodiments will be mainly described.

Referring to FIG. 9, the piezoelectric generator 300 includes first and second electrodes 311 and 312 disposed by being spaced apart from each other, first and second insulation layers 321 and 322 disposed on the first and second electrodes 311 and 312, and a piezoelectric structure disposed between the first insulation layer 321 and the second insulation layers 322. The first electrode 311 may be a flexible electrode substrate. That is, the first electrode 311 may be a flexible and conductive substrate. For example, the first electrode 311 may be a metal substrate or a conductive polymer substrate. Herein, the metal substrate, for example, may include at least one of Al, Cu, Au, and Ag. However, these are only exemplary and various metals may be included. The first electrode 311 may have a thickness of about 500 μm or less and, for example, the first electrode 311 may have a thickness of about 50 μm or less. However, the thickness of the first electrode 311 is not limited thereto.

The first insulation layer 321 is disposed on the first electrode 311. The first insulation layer 321 may act to prevent a short circuit between the first electrode 311 and the second electrode 312. The first insulation layer 321 may include a flexible material having a high dielectric constant. For example, the first insulation layer 321 may include a polymer such as PMMA. However, the first insulation layer 321 is not limited thereto. The first insulation layer 321 may have a thickness of about 2 μm, and for example, the first insulation layer 321 may have a thickness of about 200 nm or less. However, the first insulation layer 321 is not limited thereto.

The piezoelectric structure is disposed on the first insulation layer 321. Specifically, a piezoelectric thin film 350 is formed on the first insulation layer 321. Herein, the piezoelectric thin film 350 may include ZnO, ZnSnO$_3$, SnO, BaTiO$_3$, NaNbO$_3$, lead zirconate titanate (PZT), or polyvinylidene fluoride (PVDF). However, the piezoelectric thin film 350 is not limited thereto and may include various piezoelectric materials. The second insulation layer 322 is disposed on the piezoelectric thin film 350. The second insulation layer 322, as the first insulation layer 321, may include a polymer, for example, PMMA. However, the second insulation layer 322 is not limited thereto. The second insulation layer 322 may have a thickness of about 2 µm, and for example, the second insulation layer 322 may have a thickness of about 200 nm or less. However, the second insulation layer 322 is not limited thereto. The second electrode 312 is disposed on the second insulation layer 322. Herein, the second electrode 312 may include a conductive material such as metal, graphene, and a conductive polymer. When a mechanical force is applied to the flexible piezoelectric generator 300 having the foregoing structure from an external environment, the piezoelectric thin film 350 is deformed, and thus, electric energy may be generated through the first and second electrodes 311 and 312.

Figure 10:
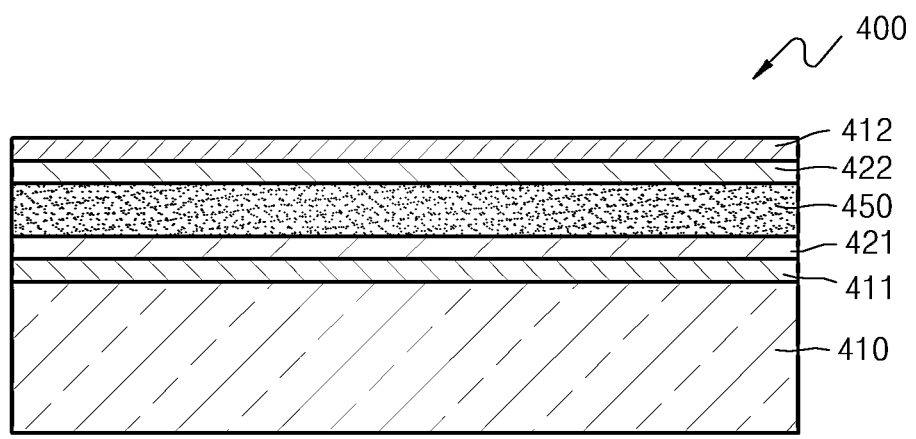
FIG. 10 illustrates a flexible piezoelectric generator according to another exemplary embodiment.

FIG. 10 illustrates a piezoelectric generator 400 according to another exemplary embodiment. Hereinafter, features different from those of the foregoing embodiments will be mainly described.

Referring to FIG. 10, the piezoelectric generator 400 includes a substrate 410, a first electrode 411 disposed on the substrate 410, a first insulation layer 421 disposed on the first electrode 411, a piezoelectric thin film 450 disposed on the first insulation layer 421, a second insulation layer 422 disposed on the piezoelectric thin film 450, and a second electrode 412 disposed on the second insulation layer 422. A flexible plastic substrate may be used as the substrate 410. Herein, the substrate 410 may have a thickness of about 500 µm or less, and for example, the substrate 410 may have a thickness of about 50 µm or less. The first electrode 411 including a conductive material is disposed on the substrate 410. Herein, the first electrode 411 may be formed by depositing predetermined metal on the substrate 410. The first electrode 411 may be formed of graphene or a conductive polymer.

The first insulation layer 421 is disposed on the first electrode 411. The first insulation layer 421 may include a polymer, for example, PMMA. The first insulation layer 421 may have a thickness of about 2 µm, and for example, the first insulation layer 421 may have a thickness of about 200 nm or less. However, the first insulation layer 421 is not limited thereto. The piezoelectric thin film 450 is formed on the first insulation layer 421. The piezoelectric thin film 450 may include ZnO, ZnSnO$_3$, SnO, BaTiO$_3$, NaNbO$_3$, PZT, or PVDF. However, the piezoelectric thin film 450 is not limited thereto and may include various piezoelectric materials.

The second insulation layer 422 is disposed on the piezoelectric thin film 450. The second insulation layer 422, as the first insulation layer 421, may include a polymer, for example, PMMA. However, the second insulation layer 422 is not limited thereto. The second insulation layer 422 may have a thickness of about 2 µm, and for example, the second insulation layer 422 may have a thickness of about 200 nm or less. However, the second insulation layer 422 is not limited thereto. The second electrode 412 is disposed on the second insulation layer 422. Herein, the second electrode 412 may include a conductive material such as metal, graphene, and a conductive polymer.

The flexible piezoelectric generators according to the foregoing embodiments may prevent a short circuit between the first electrode and the second electrode by forming the thin first and second insulation layers at both ends of the piezoelectric nanowires, may improve power generation performance, and may be manufactured in a large area. That is, the thin first insulation layer formed of a polymer, such as PMMA, is formed on the first electrode before the hydrothermal process is performed, and thus, a short circuit between the first electrode and the second electrode may be prevented. Also, even in the case that an inexpensive metal substrate, such as an Al foil, is used as a first electrode, piezoelectric nanowires, such as ZnO nanowires, may be uniformly grown due to the first insulation layer formed on the Al foil. Therefore, a flexible piezoelectric generator may be realized in which ZnO nanowires having excellent piezoelectric properties are grown in a large area on the first electrode formed of inexpensive metal.

While exemplary embodiments have been particularly shown and described, it will be understood by those of ordinary skill in the art that various changes in form and details may be made therein without departing from the spirit and scope of the inventive concept as defined by the following claims.

What is claimed is:
1. A piezoelectric generator comprising:
a first electrode;
a first insulation layer disposed on the first electrode;
a piezoelectric structure disposed on the first insulation layer and including a material generating piezoelectric potential at both ends of the piezoelectric structure by deformation;
a second insulation layer disposed on the piezoelectric structure; and
a second electrode disposed on the second insulation layer.
2. The piezoelectric generator of claim 1, wherein the first electrode is a flexible and conductive substrate.
3. The piezoelectric generator of claim 2, wherein the first electrode is a metal substrate or a conductive polymer substrate.
4. The piezoelectric generator of claim 3, wherein the metal substrate comprises at least one of Al (aluminum), Cu (copper), Au (gold), and Ag (silver).
5. The piezoelectric generator of claim 2, wherein the first electrode has a thickness of about 500 µm or less.
6. The piezoelectric generator of claim 1, wherein the first electrode is disposed on a flexible plastic substrate.
7. The piezoelectric generator of claim 6, wherein the first electrode comprises metal, a conductive polymer, or graphene.
8. The piezoelectric generator of claim 6, wherein the plastic substrate has a thickness of about 500 µm or less.
9. The piezoelectric generator of claim 1, wherein the first and the second insulation layers comprise a polymer.
10. The piezoelectric generator of claim 9, wherein the first and the second insulation layers comprise polymethyl methacrylate.
11. The piezoelectric generator of claim 1, wherein the first and the second insulation layers have a thickness of about 2 µm or less.
12. The piezoelectric generator of claim 1, wherein the piezoelectric structure comprises a plurality of piezoelectric nanowires.
13. The piezoelectric generator of claim 12, wherein the piezoelectric nanowires comprise ZnO, ZnSnO$_3$, or SnO.
14. The piezoelectric generator of claim 12, wherein a seed layer is further disposed between the first insulation layer and the piezoelectric nanowires.

15. The piezoelectric generator of claim 14, wherein the seed layer comprises at least one of ZnO, Zn, ZnSnO$_3$, SnO, Sn, and Au.

16. The piezoelectric generator of claim 1, wherein the piezoelectric structure comprises a piezoelectric thin film.

17. The piezoelectric generator of claim 16, wherein the piezoelectric thin film comprises ZnO, ZnSnO$_3$, SnO, BaTiO$_3$, NaNbO$_3$, PZT, or PVDF.

* * * * *